United States Patent [19]

Ishikawa et al.

[11] Patent Number: 4,795,990

[45] Date of Patent: Jan. 3, 1989

[54] TRAP CIRCUIT WITH TWO VARIABLE INDUCTORS

[75] Inventors: Takayoshi Ishikawa; Yasuhiko Yoshida, both of Osaka, Japan

[73] Assignee: Matsushita Electric Industrial Co., Ltd., Osaka, Japan

[21] Appl. No.: 856,784

[22] Filed: Apr. 17, 1986

[30] Foreign Application Priority Data

Apr. 18, 1985 [JP] Japan .............................. 60-82803
Dec. 10, 1985 [JP] Japan .............................. 60-277127

[51] Int. Cl.⁴ ............................................. H03H 7/00
[52] U.S. Cl. ..................................... 333/176; 333/170
[58] Field of Search .............. 333/170, 171, 172, 174, 333/175, 167–169, 176, 177; 358/31, 196, 197

[56] References Cited

U.S. PATENT DOCUMENTS

| | | | |
|---|---|---|---|
| 3,024,421 | 3/1962 | Clark | 333/124 X |
| 3,562,411 | 2/1971 | Poppa | 333/170 |
| 3,562,417 | 2/1971 | Poppa | 333/170 |
| 3,947,629 | 3/1976 | Tanaka et al. | 358/196 |
| 4,263,619 | 4/1981 | Theriault | 333/176 |
| 4,272,743 | 6/1981 | Evans | 333/176 |
| 4,376,953 | 3/1983 | Naimpally | 358/196 |

FOREIGN PATENT DOCUMENTS

| | | | |
|---|---|---|---|
| 1300951 | 7/1962 | France | |
| 0071930 | 6/1977 | Japan | 358/196 |
| 0096771 | 7/1980 | Japan | 358/196 |
| 0211815 | 12/1982 | Japan | 333/167 |

*Primary Examiner*—Eugene R. LaRoche
*Assistant Examiner*—Seung Ham
*Attorney, Agent, or Firm*—Lowe, Price, LeBlanc, Becker & Shur

[57] ABSTRACT

In a bridge T type trap circuit having CR delta connection circuit and a variable LC tank circuit, the CR delta connection circuit is connected to the LC tank circuit via a variable inductor (19; 31, 33; 40). In one embodiment, a capacitor (18) is coupled with the variable inductor (19; 31, 33) to form another LC tank circuit. In another embodiment, a variable inductor (39) used in the first-mentioned LC tank circuit has a tap which is grounded. Impedance values of the first-mentioned LC tank circuit and the variable inductor (40) are adjusted so that absolute values of real and imaginary parts thereof have a given relationship. A resistor (22) of the CR delta connection circuit is used in common in a double-trap structure having two CR delta connection circuits and two series circuits each having two LC tank circuits.

9 Claims, 6 Drawing Sheets $R_1(f_0)$ — REAL PART OF $Z_3$ AT $f_0$
$X_1(f_0)$ — IMAGINARY PART OF $Z_3$ AT $f_0$ $R_2(f_0)$ — REAL PART OF $Z_4$ AT $f_0$
$X_2(f_0)$ — IMAGINARY PART OF $Z_4$ AT $f_0$ $R_3(f_0)$ — REAL PART OF $Z_5$ AT $f_0$
$X_3(f_0)$ — IMAGINARY PART OF $Z_5$ AT $f_0$

TRAP CIRCUIT WITH TWO VARIABLE INDUCTORS

BACKGROUND OF THE INVENTION

1. Field of the Invention

This invention relates generally to trap circuits used for removing interference signals in various signal processing circuits such as a television receiver, video tuner, satellite communication system or the like.

2. Prior Art

Trap circuits of bridge T type used for the above-mentioned various apparatus handling radio frequencies are well known in VHF/UHF/SHF/microwave art. In conventional trap circuits of the above-mentioned type, an inductor of variable inductance type is used so as to obtain a desired frequency, while a variable resistor is used for obtaining maximum attenuation. However, with such a conventional trap circuit the capacitance of a capacitor coupled with the variable inductor in parallel must be extremely small when it is necessary to obtain a very sharp trapping characteristic at a high frequency such as several hundreds MHz, while the resistance of the variable resistor must be very large. As a result, insertion loss of such a trap circuit is very large. When it is intended to obtain a further sharper trapping characteristic, the value of the capacitors must be further reduced to be smaller than 1 pF which is difficult to actualize.

In the case two traps are needed, when the conventional trap circuit is adjusted so that the attenuation of one trap is maximum, then the attenuation of the other trap does not equal maximum.

SUMMARY OF THE INVENTION

The present invention has been developed in order to remove the above-described drawbacks inherent in the conventional trap circuits.

It is, therefore, an object of the present invention to provide a new and useful trap circuit with which sharp trapping characteristic can be obtained with less insertion loss.

According to a feature of an embodiment of the present invention, two traps can be simultaneously obtained with sharp trapping chracteristic and less insertion loss where maximum attenuation can be obtained at both traps.

In accordance with the present invention there is provided a trap circuit comprising: a delta connection circuit having a resistor and first and second capacitors connected to said resistor; and LC tank circuit having a first inductor and a third capacitor, one junction between said first inductor and said third capacitor being grounded; and a second inductor interposed between said delta connection circuit and the other junction between said first inductor and said third capacitor.

In accordance with the present invention there is also provided a trap circuit comprising: a delta connection circuit having a resistor and first and second capacitors connected to said resistor; a first LC tank circuit having a first inductor and a third capacitor, one junction between said first inductor and said third capacitor being grounded; and a second LC tank circuit having a second inductor and a fourth capacitor, said second LC tank circuit being interposed between said delta connection circuit and the other junction between said first inductor and said third capacitor of said first LC tank circuit.

In accordance with the present invention there is further provided a trap circuit comprising: a delta connection circuit having a resistor and first and second capacitors connected to said resistor; an LC tank circuit having a first inductor and a third capacitor, said first inductor having a tap which is grounded; and a second inductor interposed between said delta connection circuit and LC tank circuit.

BRIEF DESCRIPTION OF THE DRAWINGS

The object and features of the present invention will become more readily apparent from the following detailed description of the preferred embodiments taken in conjunction with the accompanying drawings in which.

The same or corresponding elements and parts are designated at like reference numerals throughout the drawings.

DETAILED DESCRIPTION OF THE INVENTION

Prior to describing preferred embodiments of the present invention, the above-mentioned conventional trap circuits will be described for a better understanding of the present invention.

Figure 1:
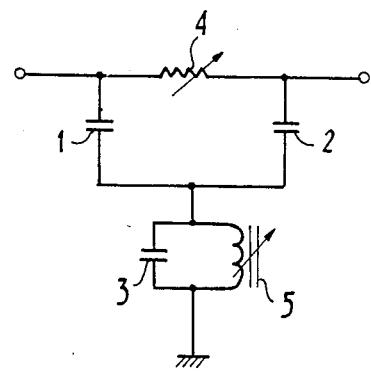
FIG. 1 is a circuit diagram showing a conventional trap circuit.

FIG. 1 shows the above-mentioned conventional trap circuit having capacitors 1, 2 and 3, a variable resistor 4, and an inductor 5. The inductor 5 is of variable inductance type so as to tune to a desired frequency. The variable resistor 4 may be adjustsed to obtain maximum attenuation.

Figure 2:
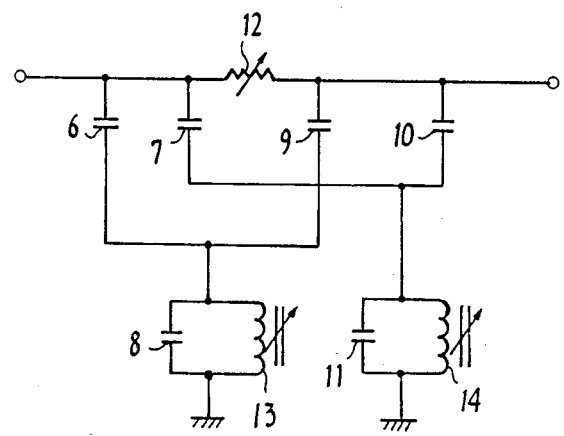
FIG. 2 is a circuit diagram showing another conventional trap circuit.

FIG. 2 shows another conventional trap circuit used for obtaining two traps at different frequencies. In order to reduce insertion loss, two bridge T traps are formed of capacitors 6, 7, 8, 9, 10, and 11, two inductors 13 and 14 and a variable resistor 12 such that the variable resistor 12 is used in common in the double-trap structure. The inductance of the inductors 13 and 14 are varied so as to tune to two different desired frequencies while the variable resistor 12 is adjusted to obtain maximum attenuation.

In the above-described conventional trap circuits, when it is intended to obtain an extremely sharp trapping characteristic, or when it is necessary to obtain a sharp trapping characteristic at a frequency higher than several hundreds of MHz, it is necessary to reduce the capacitance of the capacitors 1 and 2 to a very small value while the resistance of the resistor 4 used for obtaining maximum attenuation becomes very large resulting in large insertion loss of the trap circuit. Moreover, when it is intended to further sharpen the trapping characteristic, the capacitance of the capacitors 1 and 2 must be further reduced to a value smaller than 1 pF. Thus it is difficult to actualize such a circuit configuration.

Furthermore, when two traps of different frequencies are required, in the conventional arrangement of FIG. 2, in order to reduce insertion loss at a variable resistor 12 is used in common so that the resistance thereof is varied to obtain a maximum attenuation at one of the two frequencies. However, it is difficult to obtain a maximum attenuation at the other frequency due to variation of the capacitances of the capacitors 6, 7, 9 and 10. Therefore, attenuation adjustment is made at the sacrifice of attenuation amount at one or both of the two traps.

The present invention which removes the above-described drawbacks will be described hereinbelow.

According to the present invention in a bridge T type trap circuit, a CR delta connection is connected to an LC tank circuit via an inductor or a circuit including an inductor. The inductor is of variable inductance type. Furthermore, in one embodiment another LC tank circuit may be used as the above-mentioned circuit including an inductor.

In this way when two LC tank circuits are connected in series to the CR delta connection circuit such that each LC tank circuit comprises a variable inductor, the resonance frequency of each of the LC tank circuit can be separately adjusted. More specifically, the resonance frequency of one of the two LC tank circuit is set to a frequency lower than a desired trap frequency while the other LC tank circuit is adjusted so that its resonance frequency is higher than the desired trap frequency. As a result, within a frequency range between these two different resonance frequecies, the inductance values of the two LC tank circuits are adjusted so that real parts and imaginary parts of the impedances of these two LC tank circuits are respectively equal to each other. As a result, maximum attenuation can be obtained at a desired frequency within the frequency range between the two resonance frequencies of the two LC tank circuits even if a fixed resistor is used in the CR delta connection circuit of the bridge T type trap circuit. Consequently, even if the fixed resistor is used in common in a double-trap structure, maximum attenuation can be obtained at two different desired frequencies.

Furthermore, with this arrangement impedance variation with respect to frequency is made larger than that in conventional arrangement, while a sharper trapping characteristic can be obtained.

In another embodiment, the inductance of the LC tank circuit is varied to vary pure resistance component, while the inductance of the inductor interposed between the CR delta connection circuit and the LC tank circuit is varied to obtain matching in imaginary part. Thus even if a fixed resistor is used in the CR delta connection circuit of the bridge T type trap circuit, a maximum attenuation can be obtained at a desired frequency. As a result, even if the fixed resistor is used in common in double-trap structure, maximum attenuation can be obtained at two different desired frequencies.

Now preferred embodiments of the present invention will be described hereinbelow.

FIRST EMBODIMENT

Figure 3:
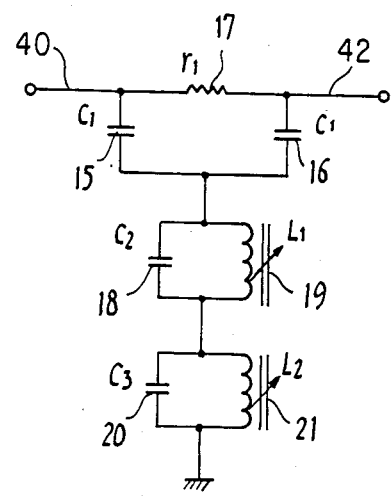
FIG. 3 is a circuit diagram showing a first embodiment trap circuit according to the present invention.

Referring now to FIG. 3, a first embodiment of the present invention is schematically shown. The illustrated trap circuit comprises capacitors 15, 16, 18 and 20, a fixed resistor 17, and two variable inductors 19 and 21. The capacitors 15 and 16 and the resistor 17 are connected in $\Delta$ connection fashion. A junction between one terminal of the resistor 17 and the capacitor 15 is used as an input terminal 40, while another junction between the other terminal of the resistor 17 and the capacitor 16 is used as an output terminal 42. The capacitor 18 and the variable inductor 19 are coupled in parallel, while the capacitor 20 and the variable inductor 21 are coupled in parallel. A junction between the capacitor 18 and the variable inductor 19 is connected to a junction between the capacitors 15 and 16. The other junction between the capacitor 18 and the variable inductor 19 is connected to a junction between the capacitor 20 and the inductor 21. The other junction between the capacitor 20 and the inductor 21 is grounded.

The capacitances of the capacitors 15, 18 and 20 are respectively expressed in terms of $C_1$, $C_2$ and $C_3$, while the inductances of the variable inductors 19 and 21 are respectively expressed in terms of $L_1$ and $L_2$. The capacitance of the capacitor 16 is equal to that of the capacitor 15, and is thus also expressed by $C_1$.

Figure 4:
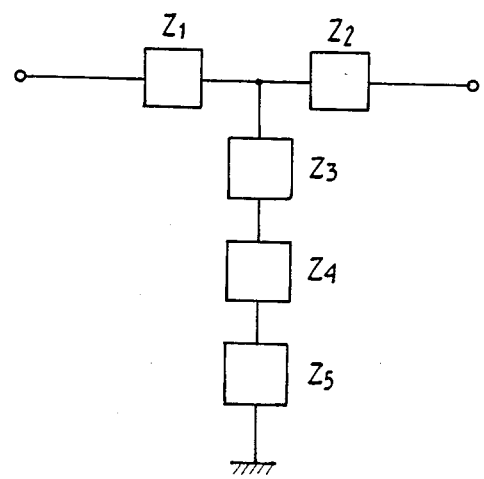
FIG. 4 is an equivalent circuit diagram of the trap circuit of FIG. 3.

When we $\Delta$-Y transform the $\Delta$ connection of the resistor 17 and the capacitors 15 and 16, we obtain an equivalent circuit of FIG. 4. In FIG. 4, the references $Z_1$, $Z_2$, $Z_3$ and $Z_4$ respectively indicate impedances. Impedances $Z_3$, $Z_4$ and $Z_5$ are given by the following equations:

$$Z_3 = -\frac{r_1}{\omega^2 C_1^2 r_1^2 + 4} - j\frac{2/\omega C_1}{\omega^2 C_1^2 r_1^2 + 4} = R_1 + jX_1 \quad (1)$$

wherein $$R_1 = -\frac{r_1}{\omega^2 C_1^2 r_1^2 + 4} \text{ and } X_1 = -\frac{2/\omega C_1}{\omega^2 C_1^2 r_1^2 + 4} \quad (2)$$

$$Z_4 = \frac{\frac{r_2}{\omega^2 C_2^2}}{r_2^2 + \left(\omega L_1 - \frac{1}{\omega C_2}\right)^2} + j\frac{\frac{1}{\omega C_2}\left(\frac{L_1}{C_2} - r_2^2\right) - \frac{\omega L_1^2}{C_2}}{r_2^2 + \left(\omega L_1 - \frac{1}{\omega C_2}\right)^2}$$

$$= R_2 + jX_2$$

wherein $$R_2 = \frac{\frac{r_2}{\omega^2 C_2{}^2}}{r_2{}^2 + \left(\omega L_1 - \frac{1}{\omega C_2}\right)^2} \text{ and } X_2 = \quad (3)$$

$$\frac{\frac{1}{\omega C_2}\left(\frac{L_1}{C_2} - r_2{}^2\right) - \frac{\omega L_1{}^2}{C_2}}{r_2{}^2 + \left(\omega L_1 - \frac{1}{\omega C_2}\right)^2}$$

$$Z_5 = \frac{\frac{r_3}{\omega^2 C_3{}^2}}{r_3{}^2 + \left(\omega L_2 - \frac{1}{\omega C_3}\right)^2} +$$

$$j\frac{\frac{1}{\omega C_3}\left(\frac{L_2}{C_3} - r_3{}^2\right) - \frac{\omega L_2{}^2}{C_3}}{r_3{}^2 + \left(\omega L_2 - \frac{1}{\omega C_3}\right)^2}$$

$$= R_3 + jX_3$$

wherein $$R_3 = \frac{\frac{r_3}{\omega^2 C_3{}^2}}{r_3{}^2 + \left(\omega L_2 - \frac{1}{\omega C_3}\right)^2} \text{ and } X_3 =$$

$$\frac{\frac{1}{\omega C_3}\left(\frac{L_2}{C_3} - r_3{}^2\right) - \frac{\omega L_2{}^2}{C_3}}{r_3{}^2 + \left(\omega L_2 - \frac{1}{\omega C_3}\right)^2}$$

Figure 5A:
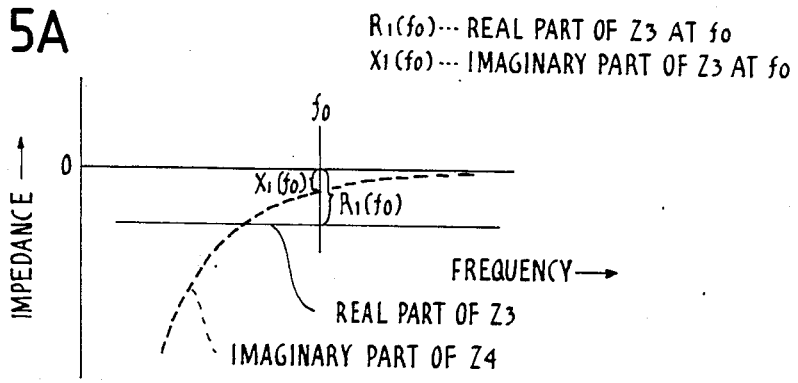
FIGS. 5A, 5B and 5C are impedance characteristic diagrams for describing the operation of the first embodiment trap circuit.
Figure 5B:
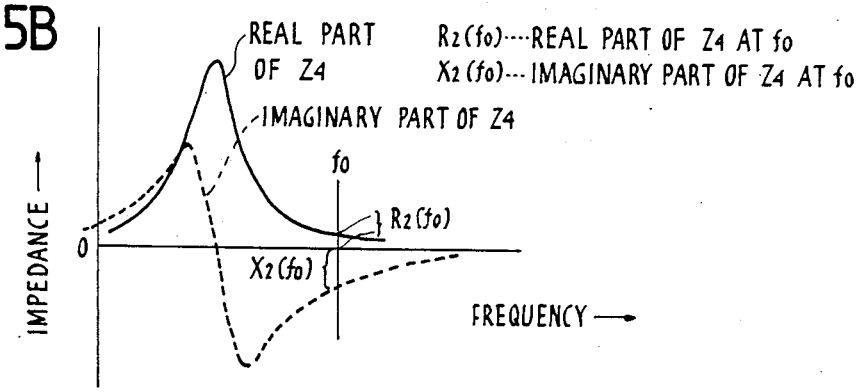
Figure 5C:
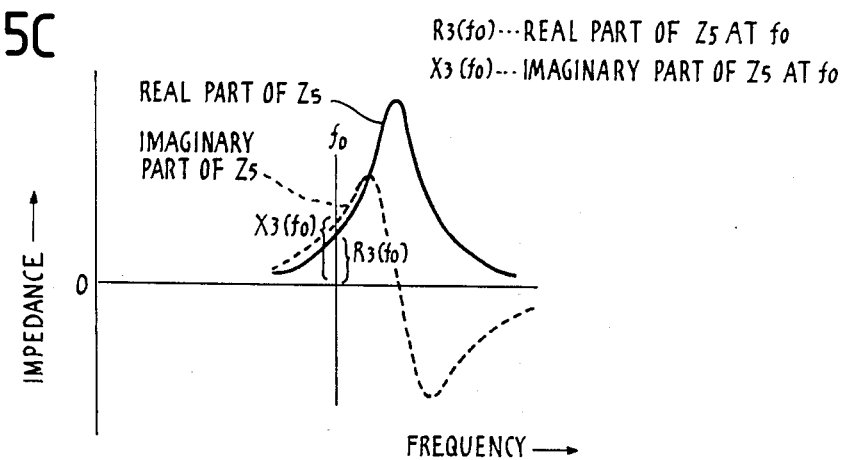

FIGS. 5A, 5B and 5C are graphs showing impedance characteristics of the above Eqs. (1), (2) and (3) with real parts and imaginary parts being separated from each other. When the term $L_1$ in Eq. (1) and the term $L_2$ in Eq. (3) are varied, both of the following relationships are satisfied simultaneously at a desired frequency fo:

$$R_1 + R_2 + R_3 = 0 \quad (4)$$

$$X_1 + X_2 + X_3 = 0 \quad (5)$$

Then resultant impedances have the following relationship:

$$Z_5 + Z_4 + Z_3 = 0 \, (f_0) \quad (6)$$

As a result, maximum attenuation can be obtained at the desired frequency fo.

SECOND EMBODIMENT

Figure 6:
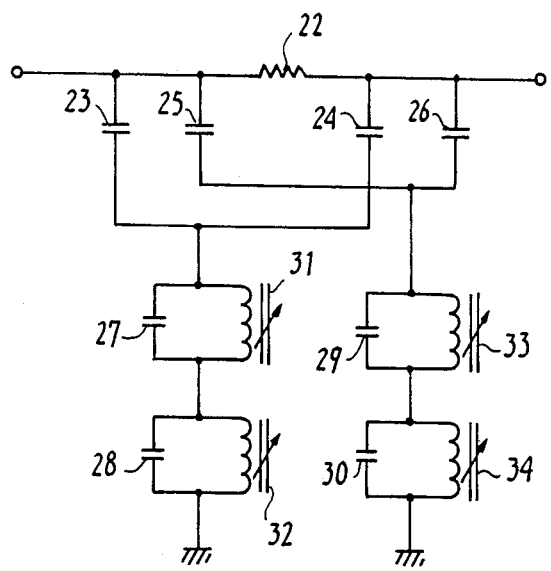
FIG. 6 is a circuit diagram showing a second embodiment trap circuit according to the present invention.

FIG. 6 shows a second embodiment of the present invention. In this second embodiment, in order to reduce the insertion loss of the trap circuit a fixed resistor 22 is used in common to two delta connection circuits including capacitors 23, 24, 25 and 26. Two parallel circuits each including a capacitor and a variable inductor are connected in series so that a series circuit of the two parallel circuits is connected to each of the two delta connection circuits in the same manner as in the first embodiment. More specifically, resonance capacitors 27 and 28 are coupled with variable inductors 31 and 32 respectively to form two parallel circuits, while other resonance capacitors 29 and 30 are coupled with variable inductors 33 and 34 respectively to form two parallel circuits.

Figure 7:
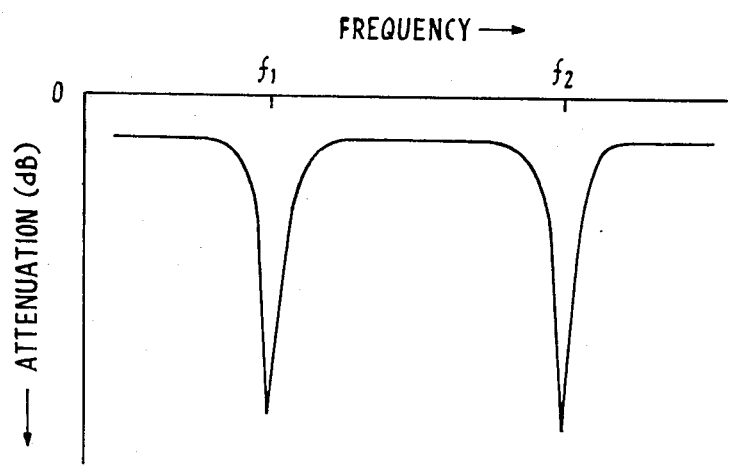
FIG. 7 is a diagram showing attenuation characteristic of the second embodiment trap circuit.

The variable inductors 31 and 32 may be adjusted to obtain a maximum attenuation at a first desired frequency $f_1$, and then the variable inductors 33 and 34 may be adjusted to obtain a maximum attenuation at a second desired frequency $f_2$. FIG. 7 is a graph showing attenuation characteristic obtained in this way.

THIRD EMBODIMENT

Figure 8:
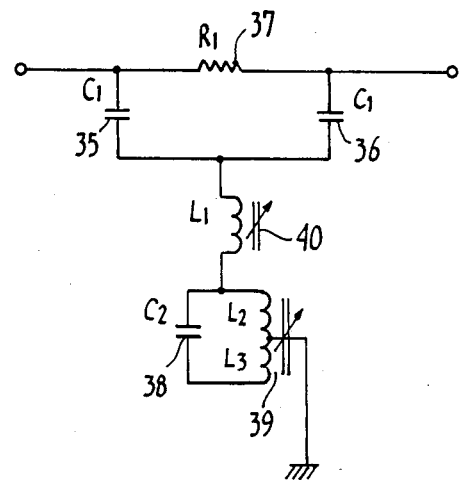
FIG. 8 is a circuit diagram showing a third embodiment trap circuit according to the present invention.

FIG. 8 shows a third embodiment trap circuit according to the present invention. The third embodiment trap circuit comprises a Δ connection circuit including two capacitors 35 and 36 and a fixed resistor 37. The capacitance of the capacitors 35 and 36 is identical and is denoted at the reference $C_1$, while the resistance of the resistor 37 is denoted at the reference $R_1$. A capacitor 38 and a variable inductor 39 are coupled in parallel to form an LC tank circuit. The variable inductor 39 has a tap which is connected to groud. A junction between the capacitor 38 and the variable inductor 39 is connected via another variable inductor 40 to a junction between the capacitors 35 and 36. The capacitance of the capacitor 38 is denoted at the reference $C_2$, while the inductance of the inductor 40 is denoted at the reference $L_1$. Similarly, the inductance between a first terminal of the inductor 39 and its tap and the other inductance between a second terminal or the inductor 39 and the tap are respectively expressed in terms of $L_2$ and $L_3$.

Figure 9:
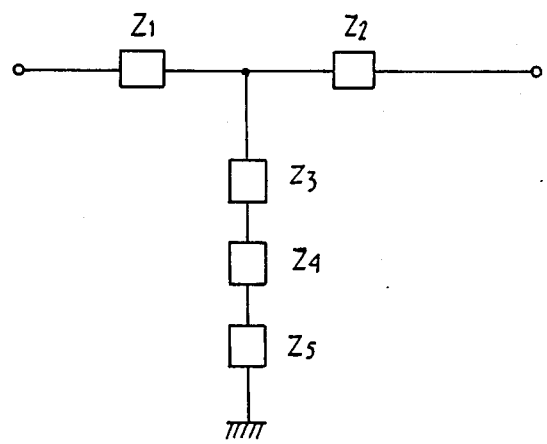
FIG. 9 is an equivalent circuit diagram of the trap circuit of FIG. 8.

In the trap circuit of FIG. 8, when we Δ-Y transform the Δ connection of the resistor 37 and the capacitors 35 and 36, we obtain an equivalent circuit of FIG. 9. In FIG. 9, the references $Z_1, Z_2, Z_3, Z_4$ and $Z_5$ respectively indicate impedances.

The impedances $Z_3, Z_4$ and $Z_5$ may be obtained in the same manner as in the first embodiment as follows:

$$Z_3 = -\frac{r_1}{\omega^2 C_1{}^2 r_1{}^2 + 4} - j\frac{2/\omega C_1}{\omega^2 C_1{}^2 r_1{}^2 + 4} = R_1 + jX_1 \quad (7)$$

$$Z_4 = r_2 + j\omega L_1 \quad (8)$$

wherein $r_2$ is a resistance component of the inductor $L_1$.

$$Z_5 = \quad (9)$$

$$\frac{\{r_3 + j\omega(L_2 + M)\}\{r_4 + jw(L_3 + M) + 1/j\omega C_2\}}{\{r_3 + j\omega(L_2 + M)\} + \{r_4 + jw(L_3 + M) + 1/j\omega C_2\}} - j\omega M$$

wherein $r_3$ is resistance component of the inductor $L_2$;

$r_4$ is resistance component of the inductor $L_3$; and $$M = K\sqrt{L_2 L_3}$$

Figure 10:
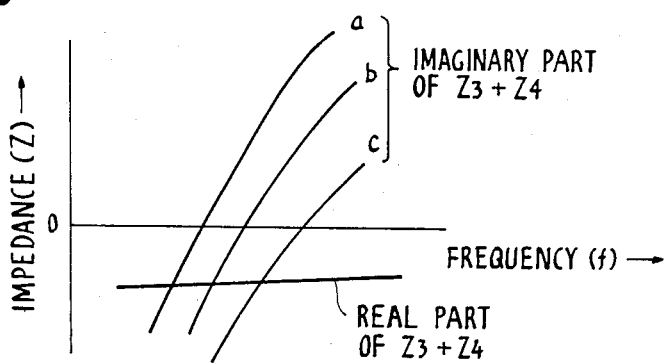
FIGS. 10, 11 and 12 are impedance characteristic diagrams describing the operation of the third embodiment trap circuit.

FIG. 10 shows the impedance characteristic of the sum $Z_3 + Z_4$ obtained by adding the above Eqs. (7) and (8) to each other. More specifically, FIG. 10 shows only a frequency range higher than a resonance frequency of the LC tank circuit. As the inductance $L_1$ is varied, the impedance characteristic change as curves a, b and c while real part of $Z_3$ and $Z_4$ does not vary.

Figure 11:
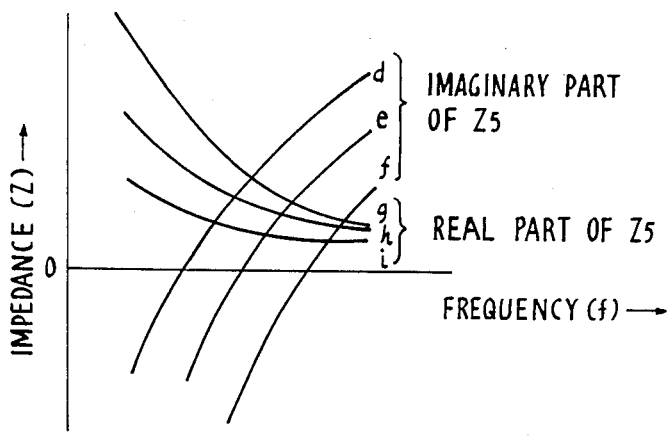

FIG. 11 shows the impedance characteristic of the impedance $Z_5$. When inductances $L_2$ and $L_3$ of the Eq. (9) are varied, the real part in Eq. (9) varies as curves d, e and f. In addition, imaginary part varies as curves g, h, and i.

Since the real part of the sum $Z_3+Z_4$ is of negative resistance, we can obtain the following relationship at a desired frequency $f_0$ when inductances $L_2$ and $L_3$ of $Z_5$ are varied so that an absolute value of the real part of $Z_5$ equals an absolute value of real part of the sum $Z_3+Z_4$ and the inductance $L_1$ of $Z_1$ is varied so that absolute value of the imaginary part of $Z_5$ is equal to an absolute value of imaginary part of the sum $Z_3+Z_4$.

$$Z_3+Z_4+Z_5=0 \ (f_0) \qquad (10)$$

Figure 12:
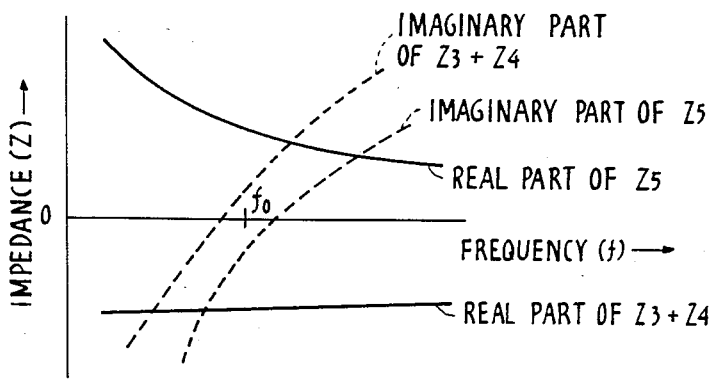

As a result, we can obtain a maximum attenuation. FIG. 12 shows characteristic impedance obtained under such condition.

The above-described embodiments are just examples of the present invention, and therefore, it will be apparent for those skilled in the art that many modifications and variations may be made without departing from the scope of the present invention.

What is claimed is:

1. A trap circuit comprising:
   (a) a delta connection circuit having a resistor and first and second capacitors connected to said resistor, said delta connection circuit having an input terminal at a first junction, between said resistor and said first capacitor, and an output terminal at a second junction, between said resistor and said second capacitor.
   (b) a first LC tank circuit having a first inductor and a third capacitor, one junction between said first inductor and said third capacitor being grounded, and
   (c) a second LC tank circuit having a second inductor and a fourth capacitor, said second LC tank circuit being interposed in a series connection between a junction of said first and second capacitors of said delta connection circuit and the other junction between said first inductor and said third capacitor of said first LC tank circuit,
   said series connection comprising a connection of a first junction of said second LC tank circuit to said junction of said delta connection circuit and connection of a second junction of said second LC tank circuit to said other junction of said first LC tank circuit.

2. A trap circuit as claimed in claim 1, wherein said first inductor comprises a tap which is grounded.

3. A trap circuit as claimed in claim 1, wherein one of said first and second LC tank circuits comprises first means for setting a resonance frequency thereof to be lower than a predetermined trap frequency, and the other of said first and second LC tank circuits comprises second means for setting a resnoance frequency thereof to be higher than said predetermined trap frequency.

4. A trap circuit as recited in claim 1 further including a second delta connection circuit, having fifth and sixth capacitors connected to a resistance therebetween and further including a third LC tank circuit having a third inductor coupled to a seventh capacitor, one junction between said third inductor and said seventh capacitor being grounded; and
   a fourth LC tank circuit having a fourth inductor coupled with an eighth capacitor, said fourth LC tank circuit being interposed between said second delta connection circuit and the other junction between said third inductor and said seventh capacitor of said third LC tank circuit.

5. A trap circuit as recited in claim 4, wherein said resistance connecting said fifth and sixth capacitors is said resistor connected to said first and second capacitors.

6. A trap circuit as recited in claim 2 wherein said first, second, third, and fourth inductors are variable inductors.

7. A trap circuit as recited in claim 5 wherein said resistor of said delta circuit is connected between said input and output terminals thereof.

8. A trap circuit comprising:
   (a) a delta connection circuit having a resistor and first and second capacitors connected to said resistor, said delta connection circuit having an input terminal at a first junction, between said resistor and said first capacitor, and an output terminal at a second junction, between said resistor and said second capacitor;
   (b) an LC tank circuit having a first inductor and a third capacitor, said first inductor having a tap which is grounded; and
   (c) a second inductor interposed in a series connection between a junction of said first and second capacitors of said delta connection circuit and said LC tank circuit.

9. A trap circuit as recited in claim 8 wherein said first and second inductors are variable inductors.

* * * * *